(12) United States Patent
Vinciarelli et al.

(10) Patent No.: US 12,267,008 B2
(45) Date of Patent: Apr. 1, 2025

(54) ACCELERATORS FOR FACTORIZED POWER SYSTEMS

(71) Applicant: Vicor Corporation, Andover, MA (US)

(72) Inventors: Patrizio Vinciarelli, Boston, MA (US); John Clarkin, Coventry, RI (US)

(73) Assignee: Vicor Corporation, Andover, MA (US)

( * ) Notice: Subject to any disclaimer, the term of this patent is extended or adjusted under 35 U.S.C. 154(b) by 190 days.

(21) Appl. No.: 17/407,430

(22) Filed: Aug. 20, 2021

(65) Prior Publication Data
US 2023/0058665 A1    Feb. 23, 2023

(51) Int. Cl.
| H02M 3/156 | (2006.01) |
| H02M 3/155 | (2006.01) |
| H02M 3/158 | (2006.01) |
| H03F 3/04 | (2006.01) |
| H02M 1/00 | (2006.01) |

(52) U.S. Cl.
CPC .............. *H02M 3/155* (2013.01); *H03F 3/04* (2013.01); *H02M 1/007* (2021.05); *H02M 3/1566* (2021.05)

(58) Field of Classification Search
CPC ............................ H02M 3/1566; H02M 1/007
See application file for complete search history.

(56) References Cited

U.S. PATENT DOCUMENTS

| 6,788,033 B2 | 9/2004 | Vinciarelli | |
|---|---|---|---|
| 6,930,893 B2 | 8/2005 | Vinciarelli | |
| 6,975,098 B2 | 12/2005 | Vinciarelli | |
| 6,984,965 B2 | 1/2006 | Vinciarelli | |
| 7,145,786 B2 | 12/2006 | Vinciarelli | |
| 7,154,250 B2 | 12/2006 | Vinciarelli | |
| 7,408,795 B2 * | 8/2008 | Vinciarelli | H02M 3/33571 363/125 |
| 7,616,465 B1 * | 11/2009 | Vinciarelli | H02M 3/1584 363/125 |
| 10,050,019 B2 | 8/2018 | Kim et al. | |
| 10,050,519 B2 | 8/2018 | Vinciarelli | |
| 10,158,357 B1 | 12/2018 | Vinciarelli et al. | |
| 10,903,734 B1 | 1/2021 | Vinciarelli | |
| 2012/0105028 A1 * | 5/2012 | Horman | H02M 1/44 323/266 |

FOREIGN PATENT DOCUMENTS

EP    1406373 A2 *    4/2004    .............. H02J 1/102

* cited by examiner

*Primary Examiner* — Sisay G Tiku
(74) *Attorney, Agent, or Firm* — Foley & Lardner LLP

(57) ABSTRACT

The system response time of a factorized power architecture may be reduced using a high bandwidth accelerator connected in parallel with a low bandwidth switching regulator to feed one or more downstream high bandwidth current multipliers, e.g. at the point of load. The accelerator may use a high speed linear amplifier to drive the factorized bus using stored energy derived from the bus or a low voltage bias supply. The accelerator may alternatively be connected in series between the switching regulator and the downstream current multipliers.

76 Claims, 10 Drawing Sheets

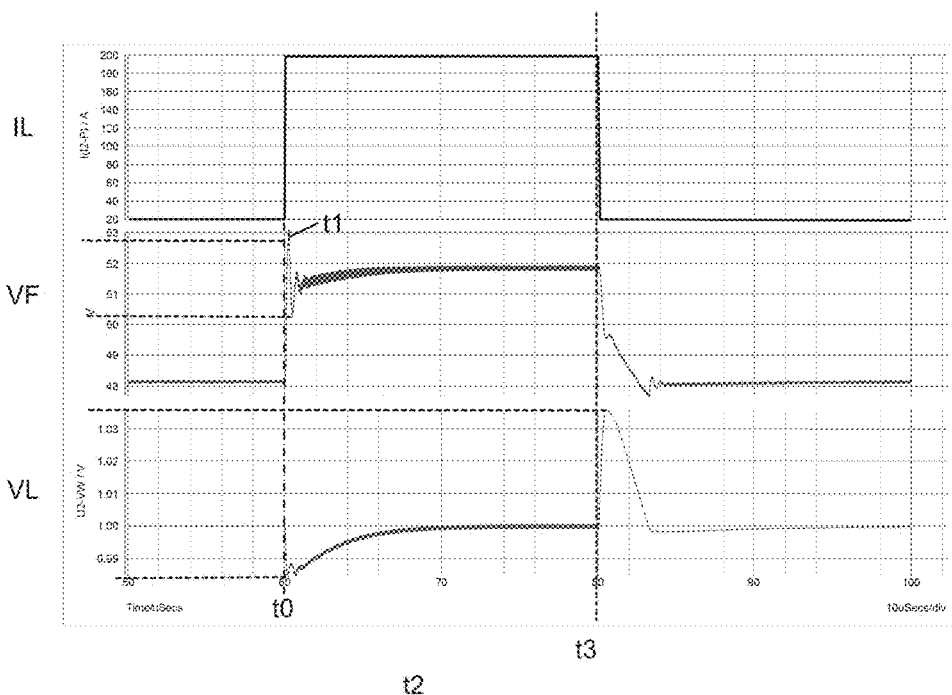
Fig. 7A
Fig. 7B
Fig. 7C
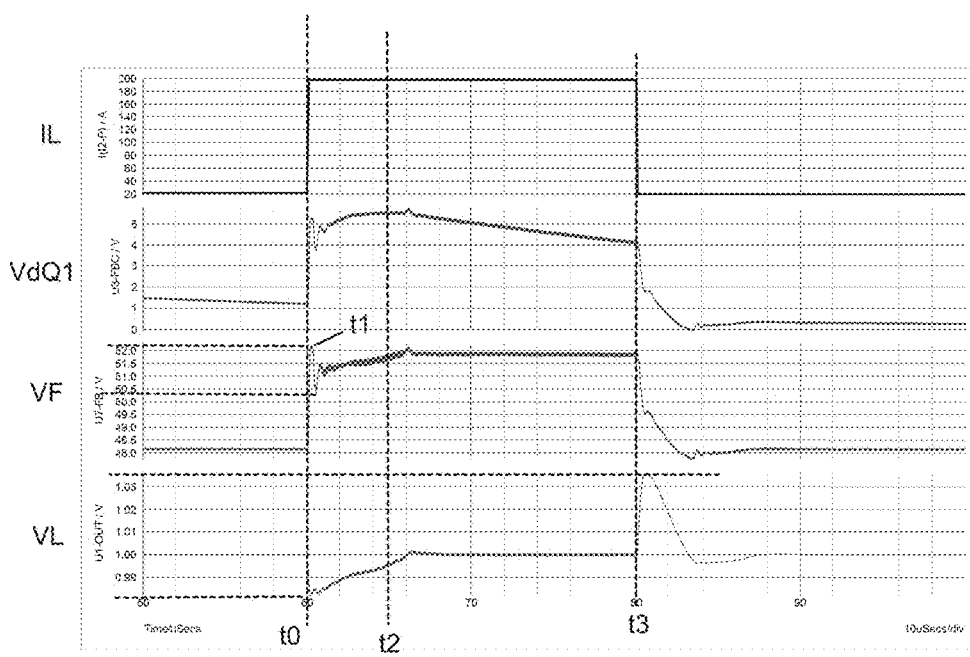
Fig. 8A
Fig. 8B
Fig. 8C
Fig. 8D

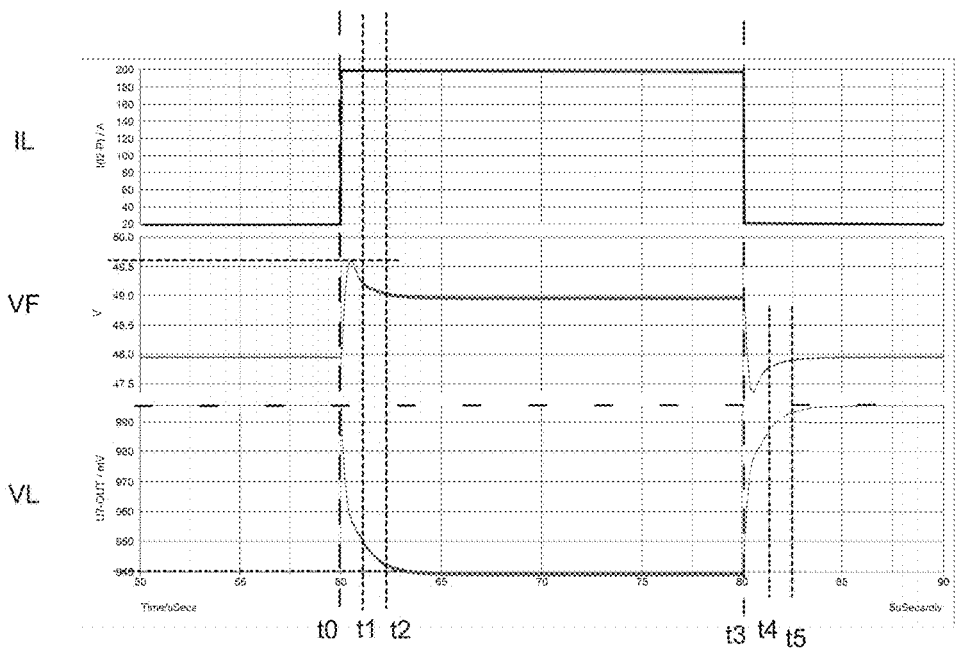
Fig. 9A
Fig. 9B
Fig. 9C
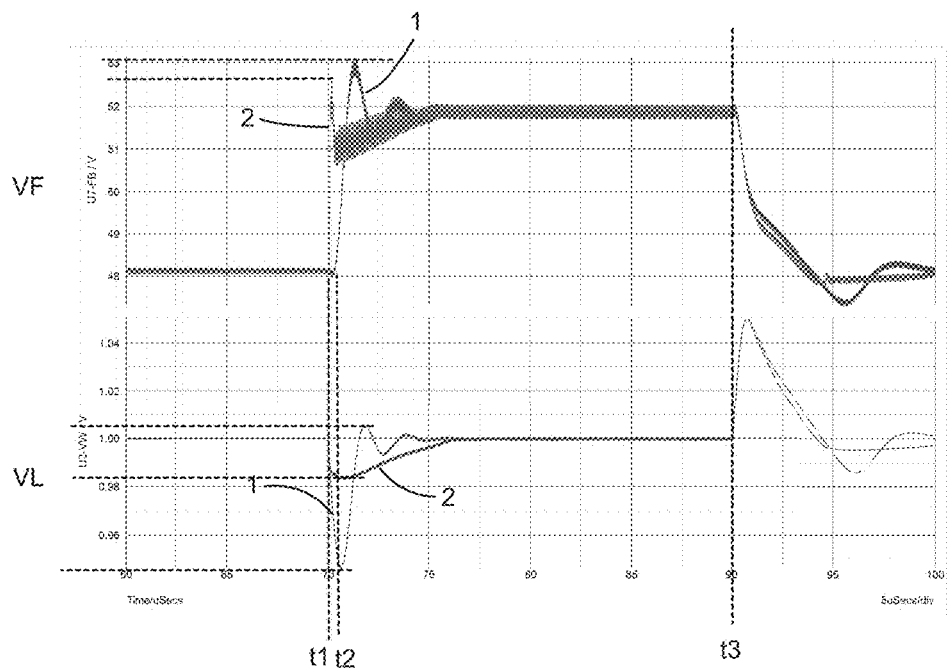
Fig. 10A
Fig. 10B

ACCELERATORS FOR FACTORIZED POWER SYSTEMS

FIELD OF THE INVENTION

This invention relates to the field of powering semiconductor loads including CPUs, GPUs, ASICs, and wafer scale devices and more particularly to improving transient performance of the power systems supplying power to such loads.

BACKGROUND

In contemporary electronic systems, space is at a premium on customer circuit boards, e.g. on a circuit board near a processor. Additionally, efficiency and thermal management considerations place limits on the power dissipation of power supplies at, or near, the point of load. Many very large scale integrated ("VLSI") semiconductor dies such as central processing units ("CPU"), graphics processing units ("GPU"), and application specific integrated circuits ("ASIC") are mounted to a multilayer ceramic substrate which translates the electrical connections from the die to larger connections suitable for interfacing with a customer motherboard. As feature sizes decrease and transistor counts increase, so too do the power supply current requirements for such large chips. Current requirements for a typical CPU can easily exceed 200 amps and for a typical GPU exceeding 1000 amps creating challenges for the package and system designers to efficiently supply such high currents. For example, power connections between the component package (such as a chip carrier or substrate or other package in or on which the semiconductor die is mounted) and the printed circuit board (PCB) on which the package is mounted may demand a large number of connector pins, leads, solder bumps, etc., to carry very high currents challenging package designers to accommodate both power and signal requirements. In many cases the large number and high frequency demands of signals may limit the maximum voltage, e.g. the interlayer breakdown voltage, to which the substrate or package may be subjected further challenging power connections to and within the package or substrate.

In some cases, a system could include a linear regulator configured to provide logic level voltages (e.g., 1.8V, 3.3V, 5V) to a VLSI at relatively low current levels, e.g., 100 mA to 30 A. The linear regulator can operate as a variable resistor such that, considering both an input voltage and a load, a constant output voltage is provided. The linear regulator can provide fast transient responses to perform regulation.

However, the linear regulator may not be suited to keep up with high current draw (e.g., up to 2000 A) and/or the steplike changes in current which may occur (e.g., 200 A to 1000 A). One barrier that prevents a linear regulator being used in the above described application may be power distribution network (PDN) losses and impedance. These losses and impedances can have significant impacts when the linear regulator is used with devices that require high current levels (e.g., 1000 A) and low logic voltages (1.0V) (for example in a GPU).

SUMMARY

One exemplary embodiment of the present disclosure is a method of providing power to a load. The method includes providing a switching regulator having a regulator input connected to receive power from a source and a regulator output for delivering a controlled voltage, Vf, to a factorized bus, the switching regulator having a regulator response time, Treg. The method includes providing a current multiplier stage having switching power conversion circuitry constructed and arranged to convert power received from the factorized bus via an input at an input voltage, Vin, for delivery to a load via an output at an output voltage, Vout, using a voltage transformation ratio, K=Vout/Vin, that is essentially constant, subject to an equivalent output resistance, the current multiplier having a multiplier response time, Tm, providing an accelerator circuit having an output connected to supply current to the factorized bus and the accelerator having an error input connected to detect perturbances in the output voltage, Vout, the accelerator responsively supplying current to the factorized bus, the accelerator having an accelerator response time, Tacc. The accelerator response time, Tacc, is shorter than the regulator response time, Treg.

Another exemplary embodiment includes a method of providing power to a load including providing a first power conversion stage having an input for receiving power from a source and an output for supplying regulated power at an output voltage, V1, the first power conversion stage having a response time, Treg. The method includes providing a second power conversion stage having switching power conversion circuitry constructed and arranged to convert power received from an input at an input voltage, Vin, for delivery to a load via an output at an output voltage, Vout, using a voltage transformation ratio, K=Vout/Vin, that is essentially constant, subject to an equivalent output resistance, the current multiplier having a multiplier response time, Tm and providing an accelerator circuit having a sense input connected to detect a perturbance in the output voltage, Vout, of the current multiplier, a high-bandwidth amplifier having an input connected to the sense input, and an accelerator output connected to supply transient power in response to a perturbance. The method includes connecting the input of the current multiplier to receive power from a factorized bus, at a factorized voltage, VF, connecting the accelerator output to supply transient power to the factorized bus, and using the accelerator to supply transient power to the factorized bus in response to the perturbance in the output voltage, Vout, of the current multiplier, within an accelerator response time, Tacc, measured from a leading edge of the perturbance to a leading edge of the transient power. The accelerator response time, Tacc, is less than the multiplier response time, Tm, and less than half of the regulator response time, Treg.

Another exemplary embodiment is a factorized power supply apparatus including a switching regulator having a regulator input connected to receive power from a source and a regulator output for delivering a controlled voltage, Vf, to a factorized bus, the switching regulator having a regulator response time, Treg. The apparatus includes a current multiplier stage having switching power conversion circuitry constructed and arranged to convert power received from the factorized bus via an input at an input voltage, Vin, for delivery to a load via an output at an output voltage, Vout, using a voltage transformation ratio, K=Vout/Vin, that is essentially constant, subject to an equivalent output resistance, the current multiplier having a multiplier response time, Tm, an accelerator circuit having an output connected to supply current to the factorized bus, the accelerator having an error input connected to detect perturbances in the output voltage, Vout, the accelerator responsively supplying current to the factorized bus, the accelerator having an accelerator response time, Tacc, and wherein the accelerator response time, Tacc, is shorter than the regulator response time, Treg (Tacc<Treg).

Another exemplary embodiment is a factorized power supply apparatus including a factorized power bus including a regulator and a current multiplier, the current multiplier configured to receive power from the factorized bus and provide output power to an electronic device, the regulator including a response time of T1 and a high bandwidth regulator configured to operate on the factorized power bus to cause a change in a demand for current to be met by the current multiplier by detecting the change in the demand for current and providing current to the factorized power bus, the high bandwidth regulator including a response time of T2. The response time T2 is at least two times faster than the response time of T1.

BRIEF DESCRIPTION OF DRAWINGS

FIGS. 7A through 7C show waveforms of a simulation of the system of FIGS. 2 and 4.

FIGS. 8A through 8D show waveforms of a simulation of the system of FIGS. 2 and 5.

FIGS. 9A through 9C show waveforms of a simulation of the system of FIGS. 3 and 6.

FIGS. 10A and 10B show simulations waveforms comparing the transient response of the system of FIGS. 2 and 4 with the accelerator enabled and disabled.

DETAILED DESCRIPTION

Figure 1:
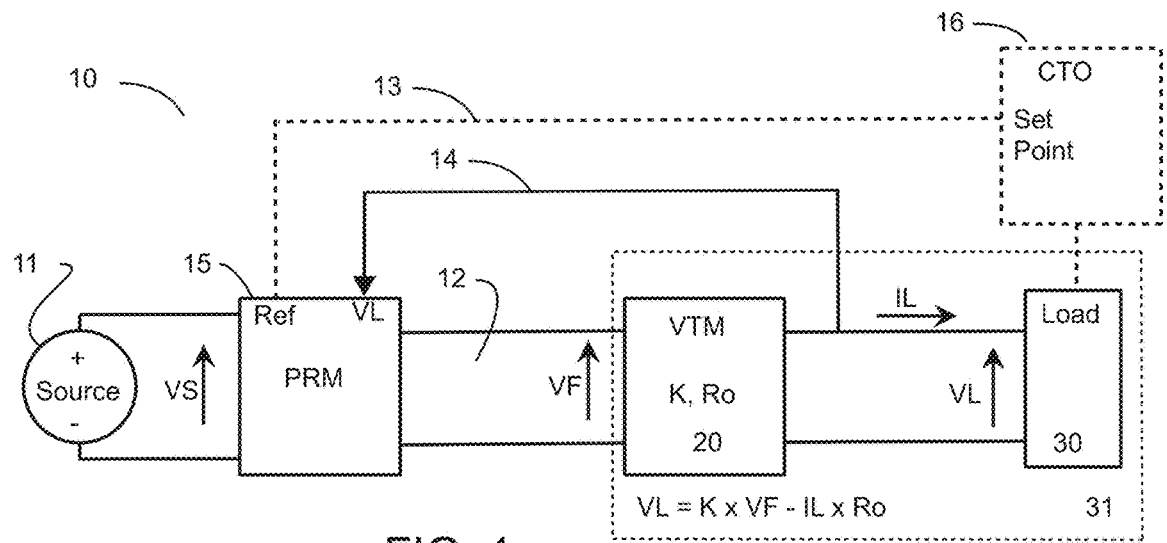
FIG. 1 shows a block diagram of a factorized power architecture ("FPA") powering a semiconductor load such as a CPU, GPU, ASIC, or other high current demanding load.

A schematic block diagram of a system for powering a semiconductor load, such as a high-power ASIC, is shown in FIG. 1. As shown, the power system 10 may include a first power converter 15 (a Pre Regulation Module (PRM)) connected to convert power received from a source 11, at a source voltage, VS, e.g. from a system power bus, (not shown), for delivery to a second stage converter 20 via a Factorized Bus, 12, at a factorized voltage, VF. The second stage converter 20 converts power from the factorized bus for delivery to a load, e.g. a semiconductor load, e.g. ASIC 30, at a load voltage, VL. As shown the second stage converter 20 may be preferably mounted in close proximity to the point of load ("PoL"), for example on or in the same package or assembly, e.g. assembly 31, as the ASIC 30. Preferably, power conversion stage 15 is a switching regulator having a nominal output voltage at or near 48 Volts DC (VF=48 VDC), and the second conversion stage is a fixed-ratio switching converter which converts the factorized bus voltage, VF, received at its input to the low voltage required by the semiconductor typically below 2 VDC (e.g., 1 VDC). In a typical factorized power system supplying power to a semiconductor load such as a CPU, GPU or ASIC, a load controller 16, e.g. CTO device, may be used to communicate with the semiconductor load 30 and set a reference (via 13) for the regulator 15 to control the voltage delivered to the load, VL. Alternatively, the regulator 15 may use an internal reference to set the load voltage. In either case, the load voltage may be fed back to the regulator 15 (via 14) which compares the sensed voltage to the reference in a negative feedback loop for controlling the load voltage.

The Factorized Power Architecture illustrated in FIG. 1 is well suited for supplying power to low voltage high current loads and is described in detail in Vinciarelli, *Factorized Power with Point of Load Sine Amplitude Converters*, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to VLT, Inc. of Andover, MA, and the entire disclosure of each patent is incorporated herein by reference).

Buck-boost power converters which are well suited for implementing the PRM 15 in FIG. 1 are described in Vinciarelli, *Buck Boost DC-DC Switching Power Conversion*, U.S. Pat. No. 6,788,033 issued Sep. 7, 2004 and U.S. Pat. No. 7,154,250 issued Dec. 26, 2006 (the "Buck-Boost patents") (both assigned to VLT, Inc. of Andover, MA, the entire disclosure of each patent is incorporated herein by reference). Buck-boost power converters with extended input-output phases to increase efficiency are described in Vinciarelli, *Control of Buck Boost Power Converter with Input Voltage Tracking*, U.S. Pat. No. 10,050,019, issued Aug. 14, 2018, (the "Extended I-O patent") (assigned to VLT, Inc. of Andover, MA, the entire disclosure of which is incorporated herein by reference).

The Sine Amplitude Converter ("SAC") topology which has a transfer function approximating Vo=$K_{VTM}$*Vin–Io*$R_{VTM}$ well suited for power converters which function as DC-to-DC transformers, fixed-ratio converters, bus converters, and Voltage Transformation Modules ("VTM"), is described in detail in Vinciarelli, *Factorized Power with Point of Load Sine Amplitude Converters*, U.S. Pat. No. 6,930,893, issued Aug. 16, 2005 (the "SAC Patent") and in Vinciarelli, *Point of Load Sine Amplitude Converters and Methods*, U.S. Pat. No. 7,145,786, issued Dec. 5, 2006 (the "POL SAC Patent") (collectively "the SAC patents") (both of which are assigned to VLT, Inc. of Andover, MA, incorporated herein by reference in their entirety).

For supplying the extremely large and fast load changes common for modern large format semiconductor devices, the interconnection impedance between the converter output terminals and the semiconductor device should be as low as possible. One way of reducing the impedance of the power connections between the power converter and the semiconductor device is to use interdigitated vertical power connections. Vertical power connections minimizing the parasitic impedance of the power connections to the semiconductor device are described in Vinciarelli et al., *Method and Apparatus for Delivering Power to Semiconductors*, U.S. Pat. No. 10,158,357 (the "MCM Patent") and Vinciarelli, *Delivering Power to Semiconductor Loads*, U.S. Pat. No. 10,903,734 (the "GCM Patent") (collectively "the Power Delivery patents") (both of which are assigned to VLT, Inc. of Andover, MA, incorporated herein by reference in their entirety).

Current implementations of PoL fixed-ratio current-multipliers 20 based upon the SAC topology operate in the 2 MHz to 4 MHz range providing excellent transient performance, e.g. a 250 nS response time and in some implementations as little as 125 nS. Present implementations of the buck-boost power regulator 15 may operate at a peak switching frequency up to 2 MHz; however, the use of extended in-out phases to improve converter efficiency may reduce the regulator response time. For example, allowing the in-out phase to extend to several microseconds while also maintaining stable closes-loop performance with adequate gain and phase margin, may restrict the regulator control loop to cross-over frequencies below 200 kHz, causing multi-microsecond delays in the regulator response to load steps. Thus, the regulator 15 may become a limiting factor for power system 10 to respond to load transients typical of modern processors. For example, current GPUs may undergo load transitions of 1000 Amps in 100 nS. Although the PoL current multiplier may be able to respond within 125 nS, the regulator does not have the bandwidth to meet the transient demand, which may allow the load voltage to drop and peak transient voltage levels to exceed acceptable limits. Efforts to maximize the ability of the regulator 15 to meet such large load steps include scaling the regulator power train for load peaks rather than steady state levels, leading to increased fixed power losses in the regulation stage.

As discussed in greater detail in FIGS. 2-13, instead of using PoL nodes to attempt to keep up with the rapid transient changes in load demand presented by VLSI devices, one or more high bandwidth regulators can be implemented to operate directly on a factorized bus including current multipliers supplying high current to low voltage VLSI devices in order to provide a fast transient response (e.g., an order of magnitude greater than conventional regulator response). The high bandwidth regulator can be configured to respond to step like changes in current draw for VLSI devices that draw high current (e.g., up to at least 1000 A, 2000 A, etc.) at very low logic levels (e.g., 1V, 1.8V, 2V, 2.5V, etc.). The high bandwidth regulator can meet the rapid transient demands of VLSI devices, e.g., in 10 nanoseconds by operating directly on the factorized bus to supply current to the factorized bus. This allows the current multipliers to keep up with the rapid changes in current draw.

Figure 2:
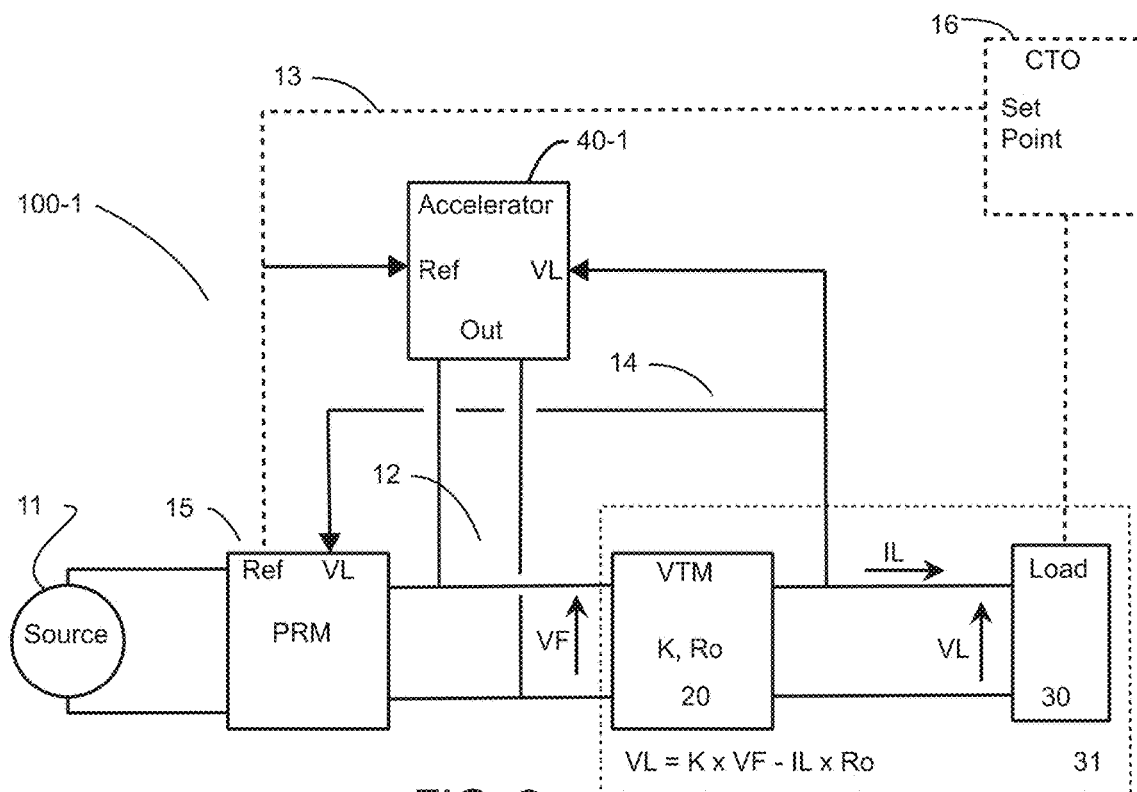
FIG. 2 shows a block diagram of an improved FPA system including a parallel accelerator.

Referring to FIG. 2, an improved FPA system 100-1 including an accelerator 40-1 connected in parallel with the regulator 15 to the Factorized Bus 12, e.g. between the regulator, e.g. PRM 15, and the current multiplier, e.g VTM 20, is shown. The regulator 15 may, for example, be a PRM based upon the topology described in the Buck-Boost patents and the Extended I-O patent. The current multiplier, VTM 20, may be based upon the SAC topology described in the SAC patents and may include multiple individual current multipliers connected in parallel to support high load currents. In some cases, linear current multipliers can respond to changes in load current draw quickly, e.g., in 100 ns. Linear current multipliers with high 1/k factors (e.g., 1/48) can enable power distribution at the factorized bus 12 (e.g., at voltage levels at 48V) that reduce PDN loseses by $K^2$.

As described in the FPA patents, the current multiplier 20 is preferably located close to the load and as described in the Power Delivery patents is preferably located on or in the same package 31 as the semiconductor load 30. As shown, the regulator 15 may sense the load voltage, VL, via feedback line 14 and using either an internal reference or an external reference, e.g. provided by an optional load controller 16, e.g. a digital control telemetry observability ("CTO") device which may communicate with the load 30, via the reference line 13 for the load voltage setpoint. The respective feedback signal 14 (VL) and reference signal 13, VLdRef, may also be input to the accelerator 40 which as described in more detail below (in combination with the current multiplier(s)) may significantly improve the transient response of the FPA system 100-1 by driving the Factorized Bus 12, e.g. supplying transient power, until the slower regulator feedback control loop catches up, reducing the response time and the peak transient voltage perturbation caused by sudden load steps.

During a load step, e.g. a rapid increase in load current, the output voltage, e.g. load voltage VL, will drop due to the effective output resistance of the current multiplier 20 until the regulator 15 can adjust its output to compensate for the additional voltage drop across the output resistance. In modern processors, the load step may be as much as 1000 Amps or more, so even with a high-performance current multiplier having an effective output resistance of 50 microOhms the voltage drop can approach 50 mV, which may be excessive for low load voltages, e.g. 1 Volt or less. Similarly, during a load dump, e.g. a rapid decrease in load current, the output voltage will increase due to the reduced voltage drop across the effective output resistance of the current multiplier 20; however, increases in load voltage in response to load dumps may not be problematic in many applications.

The parallel accelerator 40-1, as shown in FIG. 2, may be connected to receive the same reference and feedback signals as used by the regulator 15. In the event the system uses the regulator's internal reference, that signal may also provided to the accelerator 40-1. The output of the parallel accelerator 40-1 may be connected to drive the factorized bus 12. As a result, the parallel accelerator 40-1 may, but need not, be located remotely from the load 30 or from the current multiplier 20, e.g. near the regulator 15, or somewhere between the regulator and the current multiplier. Alternatively, the accelerator 40-1 may be located close to the current multiplier 20 or even integrated with it into a common package (not shown).

Figure 4:
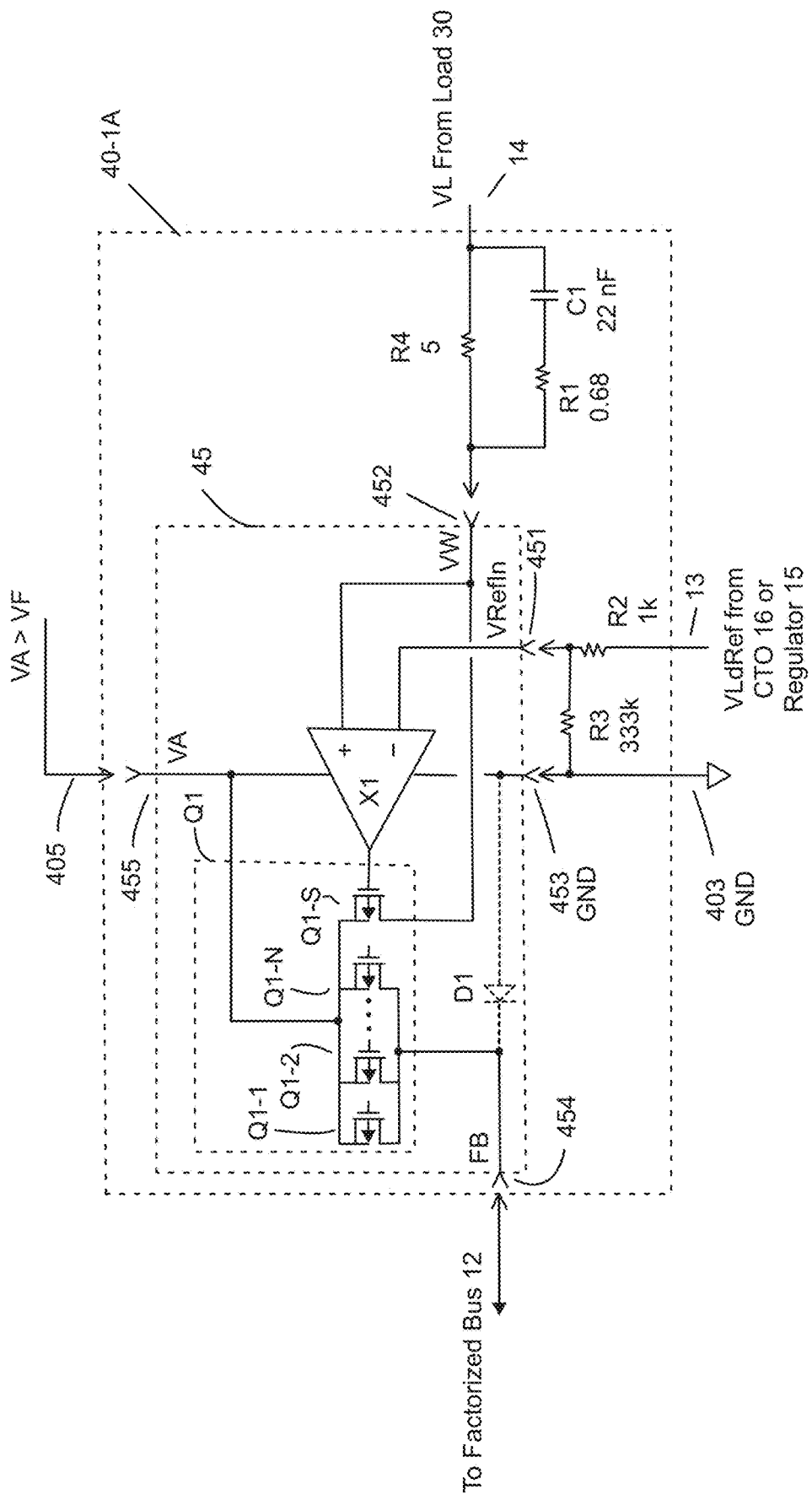
FIG. 4 shows a schematic diagram of a first accelerator embodiment.

A first embodiment of a parallel Accelerator 40-1 will be described in connection with FIGS. 2, and 4. In FIG. 4, the parallel accelerator 40-1A is shown including a semiconductor device 45 (including amplifier X1, P-channel MOSFET Q1, and an optional diode D1) and several discrete components (including resistors R1, R2, R3, R4, and capacitor C1), which as shown in FIG. 4 may be external to the semiconductor device 45. Amplifier X1 is shown connected to drive the factorized bus via transistor Q1. The output of amplifier X1 is connected to the gates of transistor Q1, which may comprises a plurality of smaller devices. As shown in FIG. 4, a majority, N, of the devices, Q1-1 through Q1-N, may be connected together in parallel to drive the the factorized bus, and one of the devices, Q1-S, may be used as a current mirror.

The operating point for amplifier X1 is set relative to and slightly lower than the load reference voltage, VLdRef, received via connection 13 (FIGS. 2, 4), using the voltage divider comprising resistors R2 and R3, which as shown produce a reference input voltage, VRefIn, that is approximately 99.7 percent of the load reference voltage, VLdRef (VRefIn=0.997*VLdRef). For a typical 1 V load, VRefIn will be about 3 mV less than VLdRef. The reference input voltage, VRefIn, is provided to the inverting input of amplifier X1. The non-inverting input of amplifier X1 is connected to sense the load voltage, VL, through resistor R4, which also carries current from the current mirror, Q1-S.

In steady state operation, the inverting input of amplifier X1, VRefIn, which will be slightly less than the load reference voltage (VRefIn<VLoadRef) and the non-inverting input of amplifier X1 will be at the load voltage (VLoad) which causes the amplifier X1 output to go high turning OFF Q1, producing no offset on resistor R4 from the current source, Q1-S. During transient conditions, a drop in load voltage VL will cause the inverting input of amplifier X1 to be at a greater potential than the non-inverting input, causing the amplifier output voltage to drop turning ON Q1. Resistor R4 sets the DC response of the accelerator and the series connected resistor R1 and capacitor C1 speed up accelerator transient response allowing the amplifier X1 to respond very quickly to changes in load voltage.

The current mirror provides negative feedback via resistor R4 which together may be scaled to approximate the incremental current required at the input of the current multiplier without impairing system stability. In one example, transistor Q1 may use 1000 devices (N=1000), Q1-1 through Q1-1000, connected in parallel to drive the factorized bus with one additional device, Q1-S to provide the feedback current, which produces a ratio of source current (Q1-S) to output current (current summed from devices, Q1-1 through Q1-1000) delivered to the factorized bus 12. In the configuration shown and using N=1000 for Q1, a 1 mA current sourced by Q1-S (which is correlates to 1 Amp output current to the factorized bus) will produce a 5 mV voltage drop across R4. Thus, the accelerator in this example will produce 200 mA of output current per 1 mV of droop in the load voltage, VL. For the transient response, the value of resistor R1 may as shown be chosen to be a small fraction of resistor R4 enabling the accelerator to overdrive the factorized bus for a very short time (determined by the R1, C1 time constant, approximately 15 nS as shown in FIG. 4) immediately in response to the load change. For example, the relative values of resistor R1 and resistor R4 in the example provides a seven times greater accelerator response to transients in the R1-C1 time constant than with Resistor R4. As discussed below in connection with FIGS. 11 through 13, different ratios, e.g. larger, and time constants, e.g. longer, may be used to improve or optimize the system response.

The bandwidth of the feedback loop around the load voltage is very high, limited only by the amplifier X1 and transistor Q1. During a load step, the drop in load voltage sensed through R1, C1 in the short term and R4 in the longer term, is amplified and drives Q1 which supplies power to the factorized bus from the slightly higher voltage source, VA. As the regulator 15 (FIG. 2) catches up with the load transient, the error sensed by amplifier X1 decreases reducing the accelerator effect on the factorized bus 12 until the load voltage once again stabilizes at the load reference level which, being slightly below the amplifier reference, disables Q2.

The parallel accelerator 40-1A may, as shown in FIG. 4, operate from a supply voltage, VA, that is greater than the factorized bus voltage, VF. Any suitable source internal or external (not shown) may be used to supply VA to the accelerator 40-1A. For example, a small boost regulator may be provided to efficiently generate voltage, VA, which may preferably be about 10% greater than the regulator output voltage, from the factorized bus, VF, to provide power to the accelerator 40-1A. The converter used to supply the voltage VA may be integrated with the accelerator onto a single die, optionally using one or more external components, e.g. a filter capacitor, or in a common package. Alternatively, an external source may be used to provide VA.

In summary, the accelerator 40-1A drives the factorized bus during load transients to a voltage that is higher than the regulator 15 output voltage from the voltage source VA that may be 5 to 10% greater than the factorized voltage. As described above the regulator error amplifier compares the load voltage to the setpoint established by the reference, i.e. the regulator control loop is not closed at its output or the Factorized Bus; therefore, the step-up in accelerator output following a load step-up does not conflict with the regulator's response. The accelerator 40-1A improves the Factorized Power Architecture response time beyond the regulator bandwidth limitation up to the bandwidth limitations of the current multiplier 20.

Referring to FIGS. 7A, 7B, and 7C, which show simulation waveforms for the system 100-1 (FIG. 2) using the first embodiment of the accelerator 40-1A during a load step from 20 to 200 Amps, including the load current, IL, (FIG. 7A); the factorized bus voltage, VF, (FIG. 7B); the load voltage, VL, (FIG. 7C). As shown in the waveforms for the factorized bus voltage, VF, (FIG. 7B) and load voltage, VL, (FIG. 7C), the system response produces a much lower peak voltage perturbation for the load step (IL going from 20 to 200 Amps at time t0) than for the load dump (IL going from 200 to 20 Amps at t3) reflecting the unidirectional configuration of the parallel accelerator used for the simulation, e.g. as shown in FIG. 4. As shown in FIG. 7B, the accelerator response to the load step at time t0 begins within nanoseconds and peaks at time t1 (about 125 nS after the t0) illustrating the overdrive response and the effects of the R1-C1 time constant, which in the example shown is about 15 ns (0.68×22 nF) which may be approximately 100 times shorter than the response time of the regulator. After the initial response, the accelerator response is dominated by the R4 path. Note that the overshoot in response to the load dump, e.g. at time t3, is limited by the energy available in the factorized bus capacitance, but may not be affected by a unidirectional accelerator, e.g. accelerator 40-1A. Optionally, a bidirectional accelerator may be provided to rapidly discharge the capacitance connected to the factorized bus to the appropriate level with, or without, energy recycling.

The semiconductor portion 45 of the parallel accelerator 40-1A described above may be integrated into a 75V capable BCD ASIC either with or without a boost converter. External components may be provided to facilitate a more general purpose semiconductor device. The accelerator may be cost effectively deployed as an optional device running from, and in parallel with, the regulator 15 as shown in FIG. 2.

While the accelerator supplies factorized bus power to the current multiplier 20, the power system efficiency is reduced by the ratio of "headroom" voltage to factorized bus voltage. This small, e.g., 5%, inefficiency is reduced by the duty cycle the of Accelerator which activates only during load transients. Assuming a 5% duty cycle for the accelerator, the efficiency impact of the Accelerator is low enough, e.g., 0.25%, to justify the benefit of much faster transient response and reduced peak voltage deviation.

The improvements in transient performance afforded by the accelerator also allow for relaxation of the regulator design requirements. For example, without the accelerator the regulator would typically be designed for the transient load requirements, rather than the steady state requirements, resulting in a regulator that is scaled to handle 50% or more than the steady state load. The larger capacity comes with increased losses and size. The reduction in size and improved efficiency in the regulator scaled for the steady state load compared to the transient load requirements more than make up for the space required by the accelerator and its relatively low inefficiency (e.g., 0.25%). For example, in a GPU application requiring 1,000 Amps continuous and 2,000 Amps peak, the accelerator would enable an approximately one third reduction in regulator size and 0.5% improvement in regulator efficiency.

Figure 5:
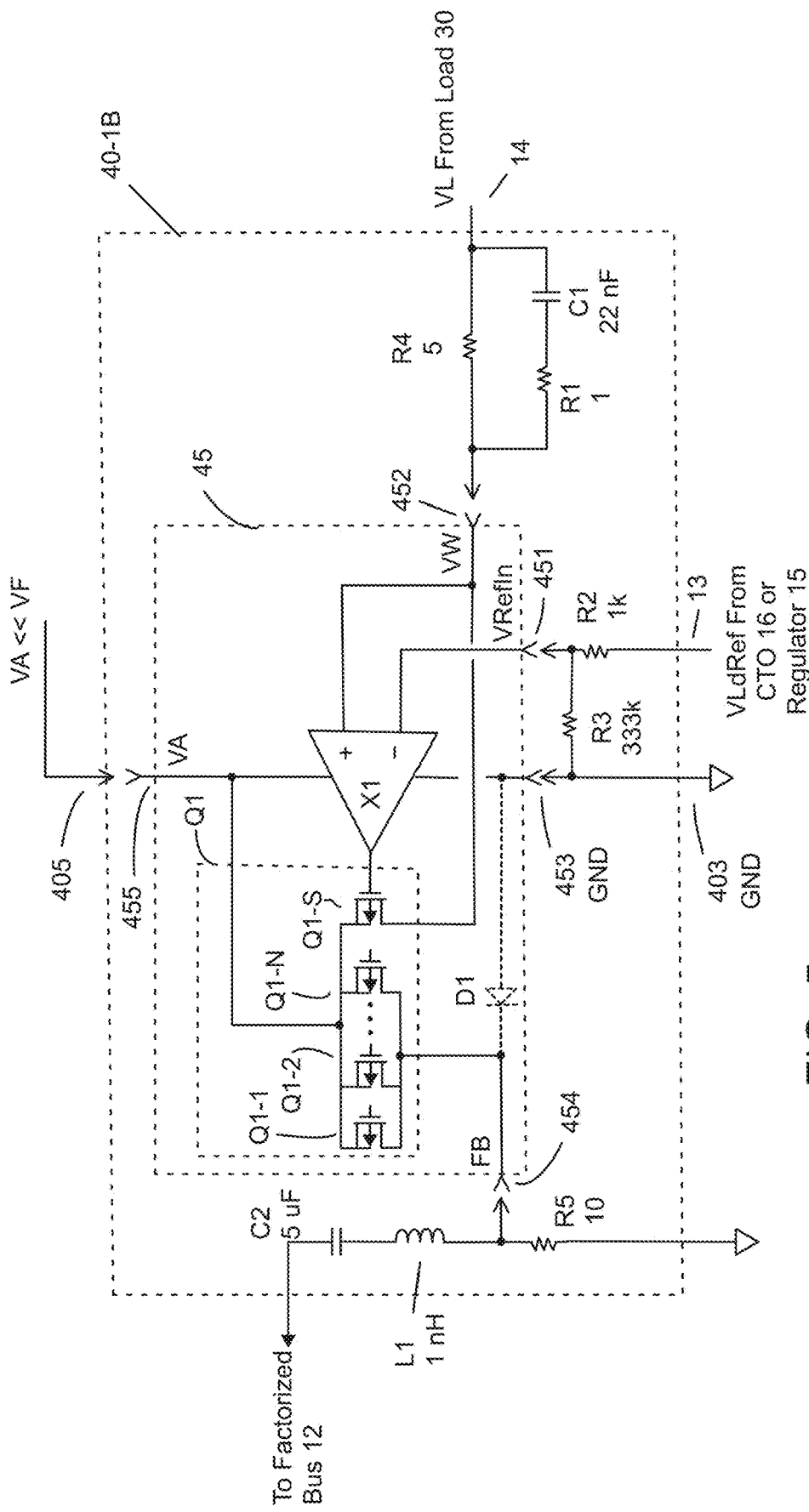
FIG. 5 shows a schematic diagram of a second accelerator embodiment.

A second preferred embodiment 40-1B of the parallel accelerator will be described with reference to FIGS. 2 and 5. Accelerator 40-1B (FIG. 5) operates from a bias voltage VA that is significantly lower (e.g. approximately one tenth) than the factorized bus voltage, VF, eliminating the need for a boost converter or other high voltage source in favor of a low voltage (e.g. 5V) source, e.g. an externally provided bias supply which is typically available in many customer applications. Preferably, the bias supply may be set to approximately 10% of the factorized bus voltage, e.g. VA=5V for VF=48V or a higher voltage if convenient. Optionally, a bipolar source may be used to power a bi-directional accelerator. Alternatively, a higher bias voltage (e.g. 10V or 20% of VF) may be used to provide 5V positive and 5V negative output excursions in a bidirectional accelerator. The semiconductor portion 45 of the accelerator 40-1B may be the same or substantially similar to that described above in connection with accelerator 40-1A of FIG. 4. However, because the amplifier operates from a low voltage supply, the semiconductor portion 45 of accelerator 40-1B may be implemented on a low voltage semiconductor platform. As shown in FIG. 5, the amplifier X1 drives the factorized bus through a 5 uF capacitor, which is charged to the factorized voltage, typically 48V, by the PRM during steady state operation, and which acts as a level shifter for the amplifier output during transient response. The 1 nH inductance shown in series with the output models parasitic inductance. A larger inductance value (e.g, 30 nH) could be used to operate the accelerator as a high frequency (e.g., 10 MHz) buck converter. Diode D1 shown in broken lines would then provide a freewheeling conduction path for the inductor allowing the accelerator to be operated as a more efficient, albeit slower responding, switching converter.

During steady state operation, the output of amplifier X1 will be high, keeping Q1 OFF, allowing capacitor C2 to charge through resistor R5 the factorized bus voltage. In response to a drop in load voltage due to a load step, the low side of the capacitor is driven higher by Q1 as described above. Assuming a 5 volt bias supply VA for the amplifier X1 in accelerator 40-1B, the amplifier output may be driven to nearly 5 Volts, which adds to the voltage stored across the capacitor, e.g. 48 Volts, to supply as much as 53 Volts to the factorized bus 12 supplying power to the downstream current multiplier 20 during the transient condition.

Referring to FIGS. 8A through 8D, which show simulation waveforms for a system 100-1 using the preferred embodiment of the parallel accelerator 40-1B during a load step from 20 to 200 Amps including the load current, IL, (FIG. 8A); the voltage at the drain of Q1, VdQ1, at terminal 454 (FIG. 8B); the factorized bus voltage, VF, (FIG. 8C); and the load voltage, VL, (FIG. 8D). At time t0, the load current increases from 20 A to 200 A causing a dip in the load voltage, VL (FIG. 7C), which is sensed at the inverting input of amplifier X1, causing the output of amplifier X1 to go low, turning Q1 ON and driving the output voltage, VdQ1, at terminal 454 high (FIG. 8B). As shown, the load voltage, VL, drops to about 0.985 V, representing a 1.5% drop, limited by the operating cycle response time of the current multiplier. VL substantially recovers, e.g. within 5 mV representing a 0.5% error, at time t2, and more fully recovers a few microseconds later. Time t2 is approximately 5 uS after t0, corresponding to the much longer characteristic response time of the regulator. As can be seen at time t3, the load current, IL (FIG. 8A) steps down from 200 A to 20 A causing an increase in the load voltage, VL (FIG. 8C). Like in the simulation of FIGS. 7A through 7C, a unidirectional configuration of parallel accelerator, e.g. as shown in 40-1B, was used in the simulation for FIGS. 8A through 8D. The perturbation in load voltage at t0 (load step) of about 15 mV compares favorably to the 35 mV perturbation at time t3 (load dump) showcasing the improvement achieved with the accelerator.

If desired, the accelerator could be configured to operate from either a bipolar bias supply, e.g. +5V and −5V, allowing the amplifier output to go negative and pull the factorize bus voltage, VF, down in response to load dumps. Alternatively, a somewhat higher unipolar bias voltage, e.g. 10V, may be used and the amplifier may be biased to keep the output at the midpoint, allowing the amplifier output to increase or decrease by half of the supply voltage, driving the factorized bus higher or lower in response to a load step or dump, respectively.

Note that the headroom voltage required of the accelerator is relatively small to make up for the IL×Rout voltage drop divided by the K. Using a K=1/48 current multiplier operating from a 48V factorized bus, having an output resistance of approximately 500 microOhms, and supplying 1V to a load that may undergo 200 A load changes, the headroom required of the accelerator is 4.8V.

Referring to FIGS. 10A and 10B, which show simulation waveforms for the system 100-1 (FIG. 2) using a parallel accelerator 40-1 during a load step from 20 to 200 Amps including the load voltage, VL, (FIG. 10A) and the factorized bus voltage, VF, (FIG. 4B) with the accelerator disabled (waveforms 1) and enabled (waveforms 2). The results of the system response (load voltage, VL) with and without the accelerator show the system's ability to respond to the load step more quickly and with a smaller perturbation in load voltage. For example, the load voltage drops to approximately 0.982 V (18 mV peak perturbation) with the accelerator enabled and to about 0.955V (45 mV peak perturbation) with the accelerator disabled, representing close to a three-fold improvement. Also note that the accelerator begins driving the factorized bus voltage, VF, much faster (waveform 2 at time t1) than the regulator 15 can, e.g. the accelerator drives VF high within tens of nanoseconds (waveform 2 at t1) compared to the approximately 1 uS required for the regulator to respond (waveform 1 at time t2). Also compare the approximately 1.2 uS delay between the positive peaks in factorized bus voltage, VF, from waveform 2 with the accelerator to waveform 1 without it, revealing an accelerator response driving the factorized bus about an order of magnitude faster than the regulator response. In terms of the converter operating period, the accelerator drives the factorized bus within a time period that is less than 50 percent, preferably less than 20 percent, and more preferably less than 10 percent of the regulator's converter operating period. A convenient way to measure the system response time is from either (a) the rising edge of the step in load current, IL; or (b) from the falling edge of the current multiplier output voltage, which in the examples shown is the load voltage, VL; to the rising edge of the voltage input to the current multiplier, which in the examples shown is the factorized bus voltage, VF. As discussed above, the simulation of FIGS. 10A and 10B assume a unidirectional accelerator configured for increases in load current as shown by the similarity in response time and peak perturbation for load dumps with and without the accelerator.

Figure 3:
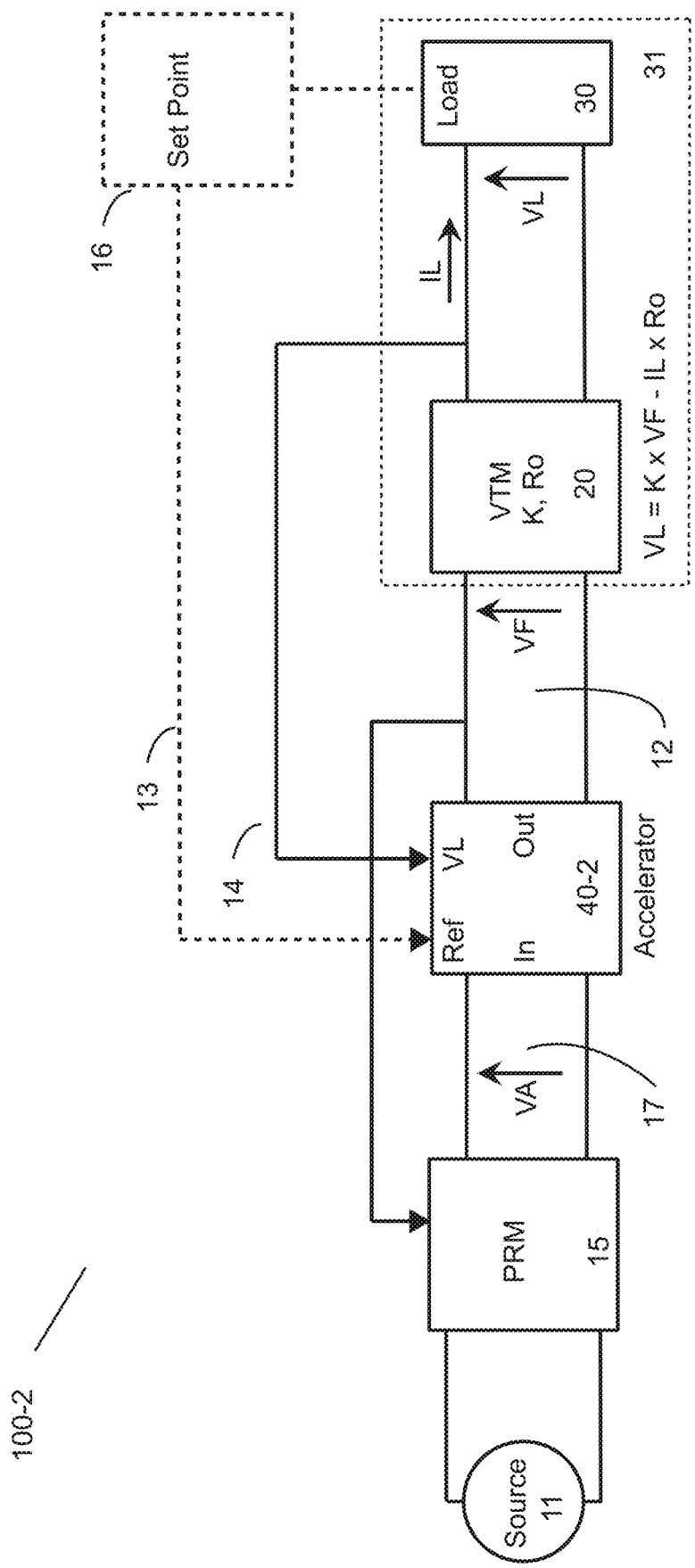
FIG. 3 shows a block diagram of an improved FPA system including a serial accelerator.

An alternate embodiment of an improved FPA system 100-2 is shown in FIG. 3 including a serial accelerator 40-2 connected between with the regulator 15 and the factorized bus 12, i.e. between the regulator, e.g. PRM 15, and the current multiplier, e.g VTM 20. In the serial system configuration shown in FIG. 3, the regulator 15 receives the factorized bus voltage, VF, as a feedback signal rather than the load voltage, VL, in the parallel embodiments. The accelerator 40-2 processes all of the power from the regulator for delivery to the current multiplier, 20. Like the system 100-1 of FIG. 2, the regulator may be a PRM based upon the topology described in the Buck-Boost patents and the Extended I-O patent and the current multiplier may be based upon the SAC topology described in the SAC patents and may include multiple individual current multipliers connected in parallel to support high load currents.

Figure 6:
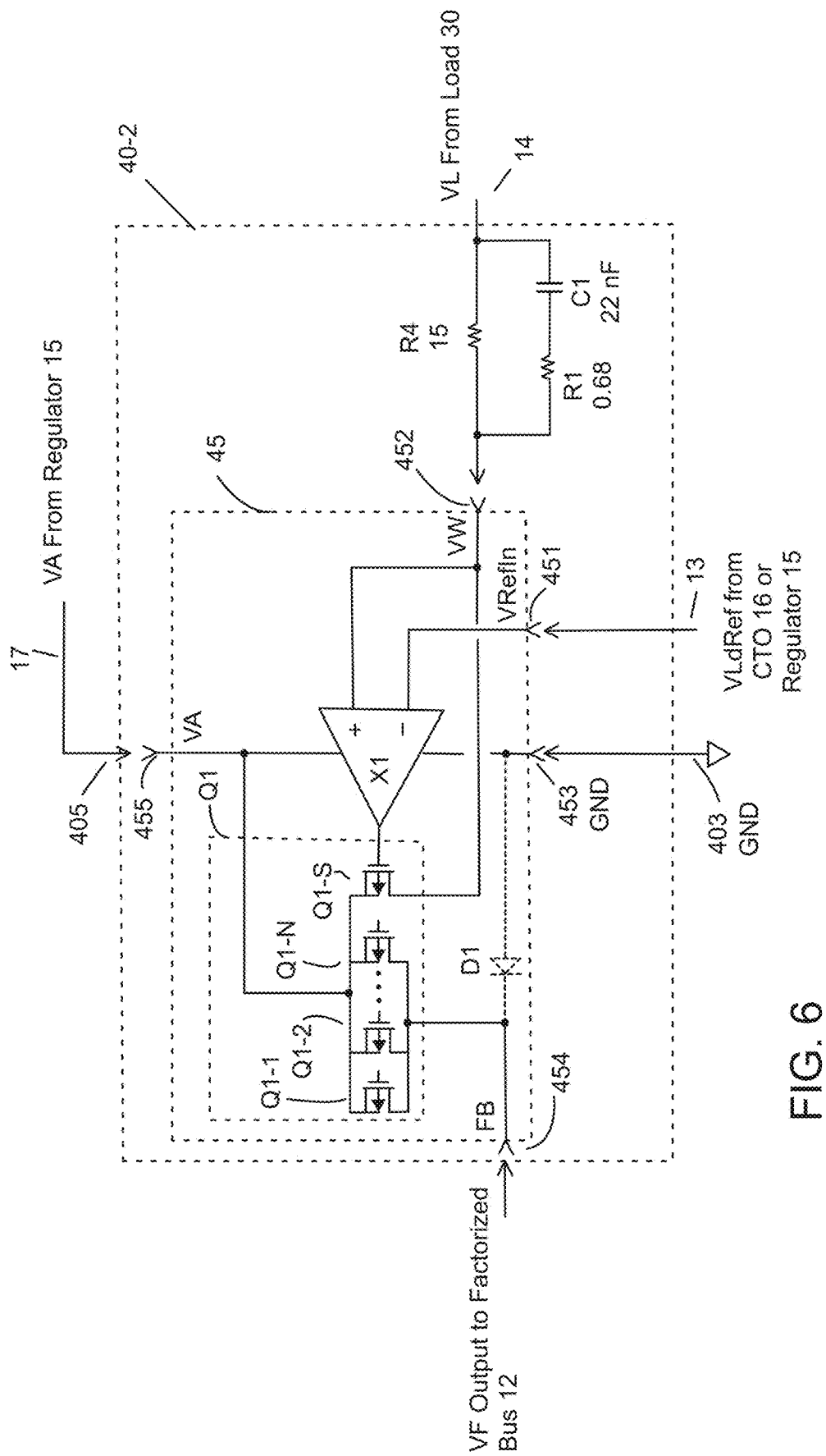
FIG. 6 shows a schematic diagram of a third accelerator embodiment.

A serial accelerator 40-2 is shown in FIG. 6 using a similar semiconductor device 45 as described above in connection with the parallel accelerator 40-1 of FIGS. 4 and 5. Like in the high voltage parallel accelerator, the semiconductor portion 45 of the serial accelerator 40-2 may be integrated into a 75V capable BCD ASIC semiconductor device. In the system 100-2 (FIG. 3), the power for the accelerator 40-2 is received on terminal 455/405 from the regulator 15 instead of a low or high voltage bias supply discussed above. The output of the serial accelerator controls the factorized bus for steady state and transient conditions (compared to the parallel accelerators that help drive the factorized bus only during transient perturbations). The load reference voltage, VLdRef, is therefore fed directly to the accelerator reference input terminal 451 (VRefIn=VLdRef) and the voltage divider resistors R2 and R3 (FIGS. 4, 5), being unnecessary, are eliminated as shown in FIG. 6. The diode D1 is also unnecessary for the serial accelerator application.

Other than being the primary source of power for the factorized bus 12 and therefore using the load reference voltage directly to do so, the serial accelerator 40-2 operates in a fashion similar to that described above. The amplifier X1 and transistor Q1 in accelerator 40-2 function in the same way: as the load voltage drops, e.g. due to an increase in load current, the amplifier X1 drives the transistor Q1 to increase drive to the factorized bus 12 and vice versa. Because the serial accelerator provides power to the factorized bus, it may incorporate load line functionality. The DC transfer function of a serial accelerator 40-2 providing "load line" control of the load voltage, VL, may be characterized by the following equation:

$$Vout = K \times Vin - K \times Iout \times F \times R$$

where F is the current mirror ratio, e.g. 1:1000 using N=1000; and R is the value of R4, e.g. 15 Ohms, K is the transformation ratio K=Vout/Vin of the current multiplier. Unlike the transfer characteristics of the current multiplier whose Rout exhibits initial value and temperature dependencies on the order of 40%, the loadline established using the accelerator (using the above equation) provides initial accuracy and temperature independency on the order of 1%.

The regulator 15 in system 100-2 (FIG. 3) may be configured to established a predetermined headroom voltage, VHR, for the accelerator, i.e. VHR=VA−VF, which may be a few volts or preferably may dynamically adjust the head room voltage, VHR, as a function of load current, e.g. reducing VHR as the load current, IL, increases.

Referring to FIGS. 9A-9C, which show simulation waveforms for a system 100-2 using the serial accelerator 40-2, the load current, IL, (FIG. 9A) undergoes a load step from 20 to 200 Amps at time t0; the factorized bus voltage, VF, is shown in FIG. 9B; and the load voltage, VL, is shown in FIG. 9C. For the simulations shown in FIGS. 9A-9C, the voltage, VA, received at terminal 405/455 from the regulator 15 was assumed to be constant at 50V and the system has been programmed for a load line response (approximately 0.31 mOhm) as shown by the steady state load voltages of 0.995V at 20 Amps and 0.940 at 200 Amps. In the simulation, the load current steps from 20 A to 200 A at time t0, the load voltage, VL, (FIG. 9B) has completed 45 mV of the 55 mV total transition approximately 125 nS later at time t1, and almost completely after another 125 nS at time t2. The load dump from 200 A to 20 A at time t3 shows a similar response indicating that the serial accelerator 40-2 in system 100-2 may provide support for both directions, load step and load dump.

Figure 11:
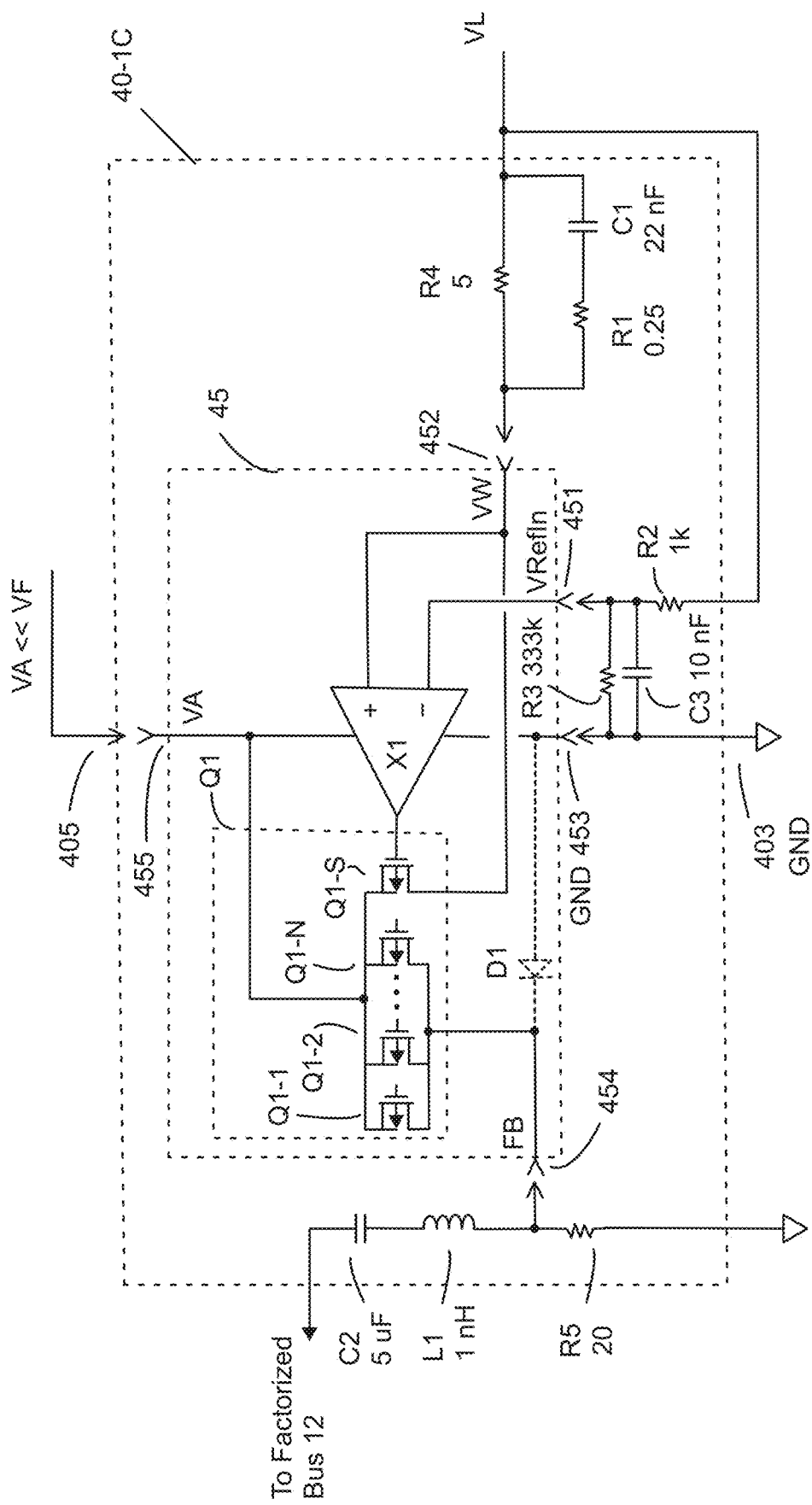
FIG. 11 shows a schematic diagram of a fourth accelerator embodiment.
Figure 12:
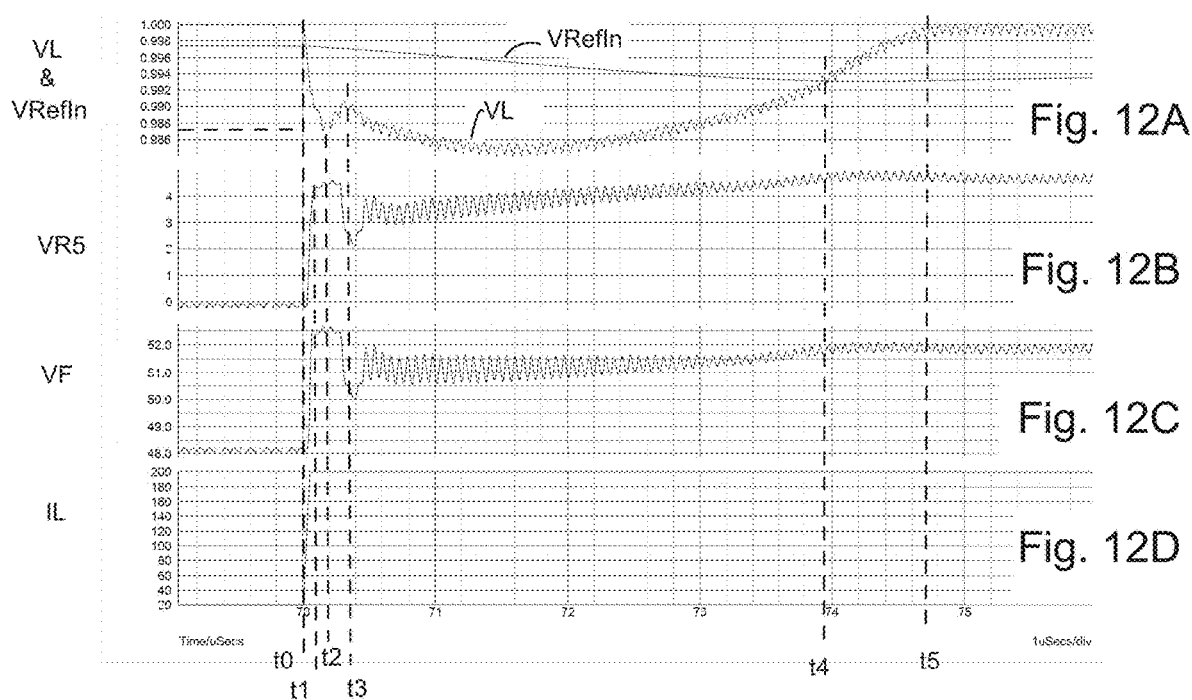
FIGS. 12A through 12D show waveforms of a simulation of the system of FIGS. 2 and 11.
Figure 13:
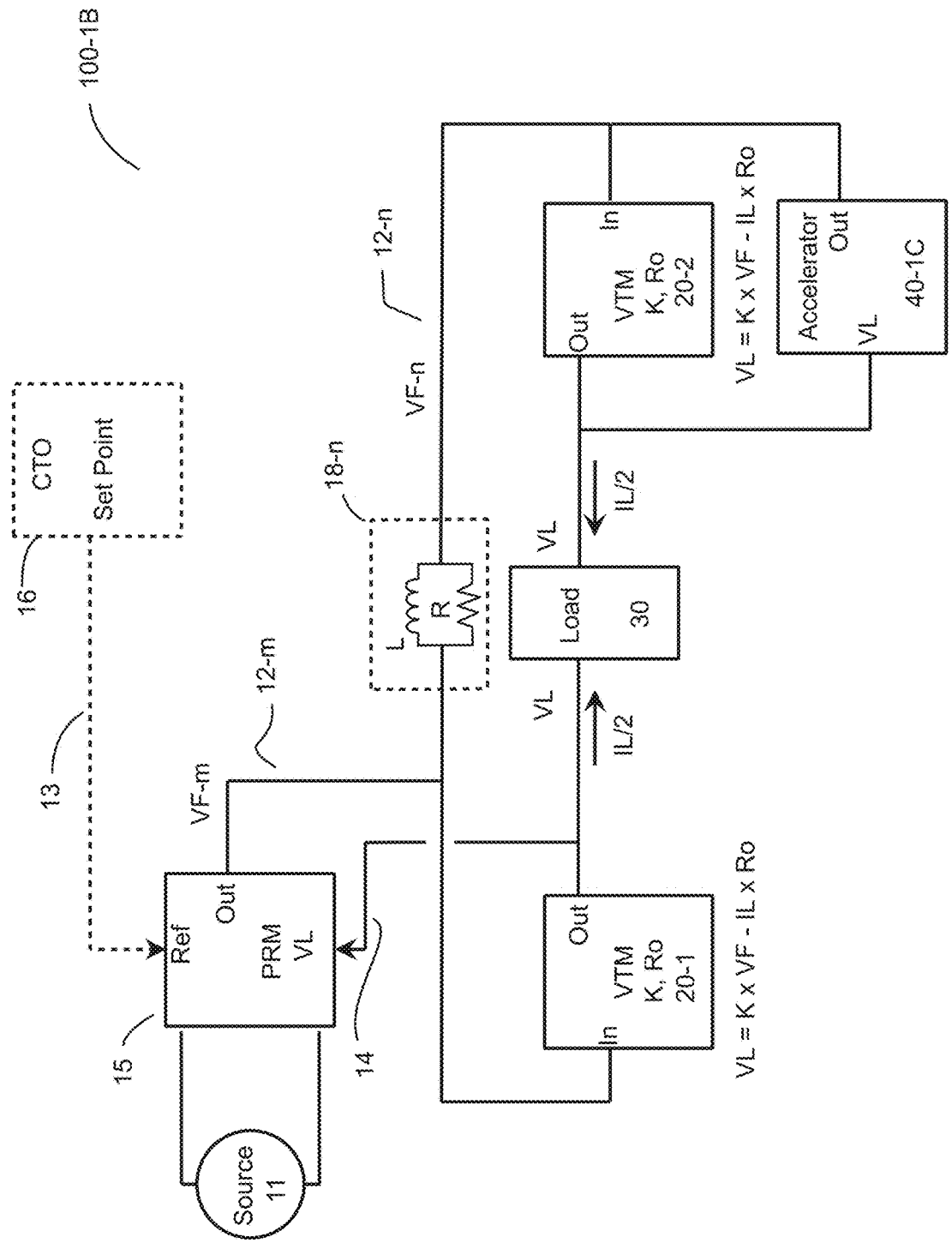
FIG. 13 shows a block diagram of an improved FPA system including one or multiple accelerators supporting one or multiple current multipliers.

An alternate embodiment of the accelerator system is shown in FIG. 13 and an alternate embodiment of the low voltage parallel accelerator is shown in FIG. 11. As shown in FIG. 11, the accelerator 40-1C includes a few modifications from 40-1B in FIG. 5: a filter capacitor C3 has been added to average the reference input voltage, VRefIn; the reference input is connected to receive the load voltage instead of the reference setpoint. With these two changes the accelerator is configured to track the load voltage and respond to perturbations relative to the averaged load voltage. Other changes include the value of resistor R5 which was changed from 10 to 20 Ohms; and resistor R1 was reduced to 0.25 Ohms and capacitor C1 was increased to 200 nF to improve the transient response of the accelerator. The changes to R1 and C1 in accelerator 40-1C of FIG. 11 increase the magnitude and duration of the accelerator overdrive (R1 provides twenty times more current per mV than R4) and the duration has been increased (the time constant increased from 15 nS to 50 nS, i.e. approximately 30 times faster than the response time of the regulator) relative to the accelerator 40-1B of FIG. 5.

Referring to FIG. 13, one or more of the accelerators 40-1C (FIG. 11) may be deployed in support of a respective one or group of current multiplier(s). The system 100-1B (FIG. 13) is analogous to the system of FIG. 2, including a regulator 15 which converts power from the source for delivery to the factorized bus at the factorized bus voltage; however in FIG. 13, the factorized bus is divided into a primary factorized bus, 12-m, connected directly to the regulator output and a subsidiary factorized bus 12-n which is decoupled from the primary factorized bus by a respective decoupling component, 18-n, which as shown may include a small inductance, L, (eg. 1 uH) and a small resistance, R, (e.g. 2 Ohms). Thus the regulator output delivers a master factorized bus voltage, VF-m, and the subsidiary factorized bus receives a respective subsidiary factorized bus voltage, VF-n.

Although processor loads and the power systems supporting them are frequently discussed in terms of a nominal voltage and current, and regulation with respect to one or more sense points, in actuality, the semiconductor device represents a distributed load with potential differences from point to point in the active area of the device. Such differences become particularly challenging during transient conditions, in which a typical processor may draw over 2000 amps compared to its steady state operation at less than 1000 amps. Higher localized current density may be addressed with deployment of a multiplicity of current multipliers and accelerators to support key areas of the device preventing voltage sagging to unacceptable levels. As shown in FIG. 13, the load 30, which may be a large scale semiconductor device such as a CPU, GPU, or ASIC, may be connected to receive power from multiple current multipliers, e.g. VTMs 20-1 and 20-2.

As shown, an accelerator 40-1C is shown connected in support of current multiplier 20-2, sensing the output voltage near the current multiplier output and driving the subsidiary factorized bus, 12-2. Although a single accelerator 40-1C is shown supporting a single current multiplier, 20-2, it should be understood that an accelerator may be provided for each respective current multiplier in the system, for a respective group of current multipliers, or any other arrangement to accommodate various load and system configurations. Multiple accelerators deployed in support of current multipliers may "accelerate" a localized factorized bus, e.g. localized factorized bus 12-n, in support of one or more respective current multipliers with appropriate decoupling, e.g. 18-n. Using multiple accelerators allows for a scalable architecture based upon smaller devices that may be readily deployed as required. The decoupling allows for further reduction in accelerator size by avoiding the need for the accelerator to drive the output filter, e.g. capacitance, associated with the output of the regulator 15.

Simulation waveforms for the accelerator 40-1C are shown in FIGS. 12A through 12D, which show the load voltage, VL, and the reference voltage, VRefIn, in FIG. 12A; the voltage across resistor R5, VR5, in FIG. 12B; the factorized bus voltage, VF, in FIG. 12C; and the load current, IL, in FIG. 12D. As shown, the reference input voltage is a moving average of the load voltage. At time t0, the load current steps from 20 to 200 Amps causing an almost immediate drop in load voltage, VL. As VL falls below the moving average, VRefIn, the accelerator respondes within 70-100 nS over-driving the factorized bus voltage, VF at time t1. The current multiplier response time is visible beginning at time t2 (about 200 nS after t0) when the load voltage, VL, stops falling and begins to rise reflecting the increase in the factorized voltage, VF. As the load voltage rises, the error voltage detected by the accelerator (VRefIn−VL) decreases reducing the accelerator response, which is visible at time t3. At time t4, the accelerator error voltage decreases to zero turning the accelerator OFF. By time t5 about 5 uS after t0, the regulator 15 has caught up and the system is back in steady state regulation.

A number of embodiments of the invention have been described. Nevertheless, it will be understood that various modifications may be made without departing from the spirit and scope of the invention. For example, [list variations].

Accordingly, other embodiments are within the scope of the following claims.

What is claimed is:

1. A method of providing power to a load, the method comprising:
   providing a switching regulator having a regulator input connected to receive power from a source and a regulator output for delivering a controlled voltage, Vf, to a factorized bus, the switching regulator having a regulator response time, Treg;
   providing a current multiplier stage having switching power conversion circuitry constructed and arranged to convert power received from the factorized bus via an input at an input voltage, Vin, for delivery to a load via an output at an output voltage, Vout, using a voltage transformation ratio, K=Vout/Vin, that is constant, based on an equivalent output resistance, the current multiplier having a multiplier response time, Tm;
   providing an accelerator circuit having an output connected to supply current to the factorized bus, the accelerator having an error input connected to detect perturbances in the output voltage, Vout, the accelerator responsively supplying current to the factorized bus, the accelerator having an accelerator response time, Tacc;
   wherein the accelerator response time, Tacc, is shorter than the regulator response time, Treg.

2. The method of claim 1 wherein the accelerator includes an amplifier, wherein the amplifier is configured to detect the perturbances in the output voltage via an input terminal of the amplifier, and an output terminal of the amplifier causes the current to be supplied to the factorized bus.

3. The method of claim 2 wherein the output terminal of the amplifier drives a gate of a switch forming a current mirror, wherein the current mirror is connected in a feedback path with the input terminal of the amplifier.

4. The method of claim 3 wherein the amplifier activates the current mirror through the gate of the switch when the perturbances in the output voltage are greater than a predetermined level and deactivates the current mirror through the gate of the switch when the perturbances in the output voltage are less than the predetermined level.

5. The method of claim 2 wherein the output terminal of the amplifier further drives gates of a set of switches that provide the current to the factorized bus.

6. The method of claim 5, wherein individual currents provided by the set of switches sum to the current provided to the factorized bus.

7. The method of claim 1 further comprising:
   providing an energy storage device connected to the accelerator, the accelerator using energy from the energy storage device to provide power to the factorized bus during transient conditions.

8. The method of claim 7 wherein the energy storage device comprises a capacitance connected to provide power to an amplifier in the accelerator.

9. The method of claim 8 further comprising providing boost switching power conversion circuitry having an output connected to charge the capacitance.

10. The method of claim 7 wherein the accelerator further comprises an amplifier and the energy storage device comprises a capacitance connected in series between the output of the amplifier and the factorized bus.

11. The method of claim 10 wherein the accelerator further comprises an inductor in series between the output of the amplifier and the factorized bus, and the accelerator further comprises a freewheeling diode.

12. The method of claim 10 further comprising providing power from a source having a source voltage, VA, that is lower than the controlled voltage, Vf to operate the amplifier.

13. The method of claim 12 further comprising setting a first accelerator response for DC signals and a second accelerator response for transient signals, the first response producing an output having a first amplitude and the second response producing an output having a second amplitude, wherein for a given perturbance magnitude, the second amplitude is greater than the first amplitude.

14. The method of claim 13, wherein the second amplitude is at least seven times greater than the first response.

15. The method of claim 13, wherein the second amplitude is at least twenty times greater than the first response.

16. The method of claim 13, wherein the second response has a time constant that is less than one tenth of an operating period of the regulator.

17. The method of claim 13, wherein the second response has a time constant that is 15-30 times faster than the regulator response time, Treg.

18. The method of claim 13 the second response has a time constant that is 50 to 100 times faster than the regulator response time, Treg.

19. The method of claim 12 further comprising, providing an accelerator response time, Tacc, measured from a leading edge of perturbance in current multiplier output current or current multiplier output voltage to a leading edge of accelerator output or factorized bus voltage that is less than a converter operating period of the regulator.

20. The method of claim 19 wherein the accelerator response time is less than one half of the converter operating period of the regulator.

21. The method of claim 19 wherein the accelerator response time is less than one half of the converter operating period of the regulator.

22. The method of claim 19 wherein the accelerator response time is less than one tenth of the converter operating period of the regulator.

23. The method of claim 10, further comprising providing a load reference signal to a reference input of the accelerator.

24. The method of claim 23, further comprising using the load reference signal received by the accelerator to provide a reduced reference signal to a reference input of the amplifier.

25. The method of claim 24, further comprising providing the output voltage, Vout, to a second reference input of the accelerator.

26. The method of claim 25, further comprising providing a filtered reference signal based upon the output voltage, Vout, to a second reference input of the amplifier.

27. The method of claim 26, wherein the accelerator uses a difference between the output voltage, Vout, and the filtered reference signal to drive the factorized bus.

28. A method of providing power to a load comprising:
providing a first power conversion stage having an input for receiving power from a source and an output for supplying regulated power at an output voltage, V1, the first power conversion stage having a response time, Treg;
providing a second power conversion stage having switching power conversion circuitry constructed and arranged to convert power received from an input at an input voltage, Vin, for delivery to a load via an output at an output voltage, Vout, using a voltage transformation ratio, K=Vout/Vin, that is constant, based on an equivalent output resistance, the current multiplier having a multiplier response time, Tm;
providing an accelerator circuit having a sense input connected to detect a perturbance in the output voltage, Vout, of the current multiplier, a high-bandwidth amplifier having an input connected to the sense input, and an accelerator output connected to supply transient power in response to the perturbance;
connecting the input of the current multiplier to receive power from a factorized bus, at a factorized voltage, VF;
connecting the accelerator output to supply transient power to the factorized bus; and using the accelerator to supply transient power to the factorized bus in response to the perturbance in the output voltage, Vout, of the current multiplier, within an accelerator response time, Tacc, measured from a leading edge of the perturbance to a leading edge of the transient power;
wherein the accelerator response time, Tacc, is less than the multiplier response time, Tm, and less than half of the regulator response time, Treg.

29. The method of claim 28, further comprising:
connecting the output of the first stage to the factorized bus and using the first stage to supply steady state power to the current multiplier.

30. The method of claim 29, further comprising providing a load reference signal to a reference input of the accelerator.

31. The method of claim 30, further comprising using the load reference signal received by the accelerator to provide a reduced reference signal to a reference input of the amplifier.

32. The method of claim 28, further comprising:
connecting the output of the first stage to an input of the accelerator and using the accelerator to supply steady state power to the current multiplier.

33. The method of claim 32, further comprising:
providing a capacitance connected to the accelerator, the accelerator using energy from the capacitance to provide power to the factorized bus during transient conditions.

34. The method of claim 33 further comprising using the capacitance to provide power to the amplifier.

35. The method of claim 34 further comprising providing boost switching power conversion circuitry to charge the capacitance.

36. The method of claim 33 further comprising connecting the capacitance in series between an output of the amplifier and the factorized bus.

37. The method of claim 36 further comprising providing power from a source having a source voltage, VA, that is lower than the first stage output voltage, V1, to operate the accelerator.

38. The method of claim 36, further comprising providing the output voltage, Vout, to a reference input of the accelerator.

39. The method of claim 36, further comprising providing a filtered reference signal based upon the output voltage, Vout, to a reference input of the amplifier.

40. The method of claim 39, wherein the accelerator uses a difference between the output voltage, Vout, and the filtered reference signal to drive the factorized bus.

41. The method of claim 36 further comprising setting a first accelerator response for slow signals and a second accelerator response for fast transient signals, the first response producing an output having a first amplitude and the second response producing an output having a second amplitude, wherein for a given perturbance magnitude, the second amplitude is greater than the first amplitude.

42. A factorized power supply apparatus comprising:
a switching regulator having a regulator input connected to receive power from a source and a regulator output for delivering a controlled voltage, Vf, to a factorized bus, the switching regulator having a regulator response time, Treg;
a current multiplier stage having switching power conversion circuitry constructed and arranged to convert power received from the factorized bus via an input at an input voltage, Vin, for delivery to a load via an output at an output voltage, Vout, using a voltage transformation ratio, K=Vout/Vin, that is constant, based on an equivalent output resistance, the current multiplier having a multiplier response time, Tm;
an accelerator circuit having an output connected to supply current to the factorized bus, the accelerator having an error input connected to detect perturbances in the output voltage, Vout, the accelerator responsively supplying current to the factorized bus, the accelerator having an accelerator response time, Tacc;

wherein the accelerator response time, Tacc, is shorter than the regulator response time, Treg.

43. The apparatus of claim 42 wherein the accelerator includes an amplifier, wherein the amplifier is configured to detect the perturbances in the output voltage via an input terminal of the amplifier, and an output terminal of the amplifier causes the current to be supplied to the factorized bus.

44. The apparatus of claim 43 wherein the output terminal of the amplifier drives a gate of a switch forming a current mirror, wherein the current mirror is connected in a feedback path with the input terminal of the amplifier.

45. The apparatus of claim 44 wherein the amplifier activates the current mirror through the gate of the switch when the perturbances in the output voltage are greater than a predetermined level and deactivates the current mirror through the gate of the switch when the perturbances in the output voltage are less than the predetermined level.

46. The apparatus of claim 43 wherein the output terminal of the amplifier further drives gates of a set of switches that provide the current to the factorized bus.

47. The apparatus of claim 46, wherein individual currents provided by the set of switches sum to the current provided to the factorized bus.

48. The apparatus of claim 42 further comprising:
an energy storage device connected to the accelerator, the accelerator using energy from the energy storage device to provide power to the factorized bus during transient conditions.

49. The apparatus of claim 48 wherein the energy storage device comprises a capacitance connected to provide power to an amplifier in the accelerator.

50. The apparatus of claim 49 further comprising boost switching power conversion circuitry having an output connected to charge the capacitance.

51. The apparatus of claim 48 wherein the accelerator further comprises an amplifier and the energy storage device comprising a capacitance connected in series between an output of the amplifier and the factorized bus.

52. The apparatus of claim 51 wherein the accelerator furthering comprises an inductor in series between the output of the amplifier and the factorized bus and furtherin including a freewheeling diode.

53. The apparatus of claim 52 wherein power from a source having a source voltage, VA, that is lower than the controlled voltage, Vf operates the amplifier.

54. The apparatus of claim 53 the accelerator including a first accelerator response for DC signals and a second accelerator response for transient signals, the first response producing an output having a first amplitude and the second response producing an output having a second amplitude, wherein for a given perturbance magnitude, the second amplitude is greater than the first amplitude.

55. The apparatus of claim 54, wherein the second amplitude is at least seven times greater than the first response.

56. The apparatus of claim 54, wherein the second amplitude is at least twenty times greater than the first response.

57. The apparatus of claim 54, wherein the second response has a time constant that is less than one tenth of an operating period of the regulator.

58. The apparatus of claim 54, wherein the second response has a time constant that is 15-30 times faster than the regulator response time, Treg.

59. The apparatus of claim 54 the second response has a time constant that is 50 to 100 times faster than the regulator response time, Treg.

60. The apparatus of claim 53 wherein the accelerator includes an accelerator response time, Tacc, measured from a leading edge of perturbance in current multiplier output current or current multiplier output voltage to a leading edge of accelerator output or factorized bus voltage that is less than a converter operating period of the regulator.

61. The apparatus of claim 60 wherein the accelerator response time is less than one half of the converter operating period of the regulator.

62. The apparatus of claim 60 wherein the accelerator response time is less than one quarter of the converter operating period of the regulator.

63. The apparatus of claim 60 wherein the accelerator response time is less than one tenth of the converter operating period of the regulator.

64. The apparatus of claim 52, wherein a load reference signal is provided to a reference input of the accelerator.

65. The apparatus of claim 64, wherein the load reference signal received by the accelerator is used to provide a reduced reference signal to a reference input of the amplifier.

66. The apparatus of claim 65, wherein the output voltage, Vout, is provided to a second reference input of the accelerator.

67. The apparatus of claim 66, wherein a filtered reference signal based upon the output voltage, Vout, is provided to a second reference input of the amplifier.

68. The apparatus of claim 67, wherein the accelerator uses a difference between the output voltage, Vout, and the filtered reference signal to drive the factorized bus.

69. A factorized power supply apparatus comprising:
a factorized power bus including a regulator and a current multiplier, the current multiplier configured to receive power from the factorized bus and provide output power to an electronic device, the regulator including a response time of T1; and
a high bandwidth regulator configured to operate on the factorized power bus to cause a change in a demand for current to be met by the current multiplier by detecting the change in the demand for current and providing current to the factorized power bus, the high bandwidth regulator including a response time of T2;
wherein the response time T2 is at least two times faster than the response time of T1.

70. The apparatus of claim 69 wherein the electronic device draws current from the current multiplier at levels up to at least 1000 ampheres at voltage levels less than 2 volts.

71. The apparatus of claim 69 wherein the high bandwidth regulator is configured to operate on the factorized power bus to cause the change in the demand for current to be met in at least 10 nanoseconds.

72. The apparatus of claim 69, wherein the change in the demand for current is a stepwise change.

73. The apparatus of claim 72 wherein the high bandwidth regulator includes an accelerator circuit having an output connected to supply current to the factorized power bus, the accelerator having an error input connected to the electronic device to detect the stepwise change in the demand for current.

74. The apparatus of claim 73 further comprising:
an energy storage device connected to the accelerator, the accelerator using energy from the energy storage device to provide power to the factorized bus to cause the stepwise change in the demand for current to be met.

75. The apparatus of claim 73 wherein the accelerator includes an amplifier, wherein the amplifier is configured to detect the change in the demand for current via an input terminal of the amplifier, and an output terminal of the amplifier causes the current to be supplied to the factorized bus.

76. The apparatus of claim 75 wherein the output terminal of the amplifier drives a gate of a switch forming a current mirror, wherein the current mirror is connected in a feedback path with the input terminal of the amplifier.

* * * * *